United States Patent
Fulford et al.

Patent Number: 6,114,211
Date of Patent: Sep. 5, 2000

[54] SEMICONDUCTOR DEVICE WITH VERTICAL HALO REGION AND METHODS OF MANUFACTURE

[75] Inventors: H. Jim Fulford, Austin; Jon Cheek, Round Rock; Derick J. Wristers; James Buller, both of Austin, all of Tex.

[73] Assignee: Advanced Micro Devices, Inc., Sunnyvale, Calif.

[21] Appl. No.: 09/195,336

[22] Filed: Nov. 18, 1998

[51] Int. Cl.$^7$ .................................................. H01L 21/336
[52] U.S. Cl. ............................................ 438/305; 438/303
[58] Field of Search .................................... 438/303–307

[56] References Cited

U.S. PATENT DOCUMENTS

| | | |
|---|---|---|
| 5,578,509 | 11/1996 | Fujita . |
| 5,595,919 | 1/1997 | Pan . |
| 5,736,446 | 4/1998 | Wu . |
| 5,830,788 | 11/1998 | Hiroki et al. . |
| 5,885,886 | 3/1999 | Lee . |

OTHER PUBLICATIONS

A 0.8UM CMOS Technology for High Performance ASIC Memory and Channelless Gate Array, IEEE, pp. 1–4, 1988.
Wolf, *Silicon Processing for the VLSI Era*, Lattice Press, vol. 2: Process Integration, pp. 354–363 (1990).
Wolf, *Silicon Processing for the VLSI Era*, Lattice Press, vol. 3, The Submicron MOSFET, pp. 232–240, (1995).
Wolf, *Silicon Processing for the VLSI Era*, Lattice Press, vol. 3, The Submicron MOSFET, pp. 309–311, (1995).
Wolf, *Silicon Processing for the VLSI Era*, Lattice Press, vol. 3, The Submicron MOSFET, pp. 621–622, (1995).

*Primary Examiner*—Charles Bowers
*Assistant Examiner*—Scott J. Hawranek

[57] ABSTRACT

One method of forming a semiconductor device includes forming a gate electrode on a substrate and then forming a spacer adjacent to a sidewall of the gate electrode. An active region is formed in the substrate adjacent to the spacer and spaced apart from the gate electrode using a first dopant material of a first conductivity type. A protecting layer is formed over the active region and adjacent to the spacer. At least a portion of the spacer is then removed to form an opening between the protecting layer and the gate electrode. In some instances, the spacer may be formed by independent deposition of two different materials (e.g., silicon nitride and silicon dioxide), one of which can be selectively removed with respect to the other. A lightly-doped region is formed in the substrate adjacent to the gate electrode using a second dopant material of the first conductivity type. This lightly-doped region may be formed, for example, prior to formation of the spacer, between the formation of two portions of the spacer, or after removing at least a portion of the spacer. A halo region is formed through the opening resulting from removing a portion of the spacer. The halo region is deeper in the substrate than the lightly-doped region and is adjacent to the active region. The halo region is formed using a third dopant material of a conductivity type different than the first conductivity type.

21 Claims, 8 Drawing Sheets

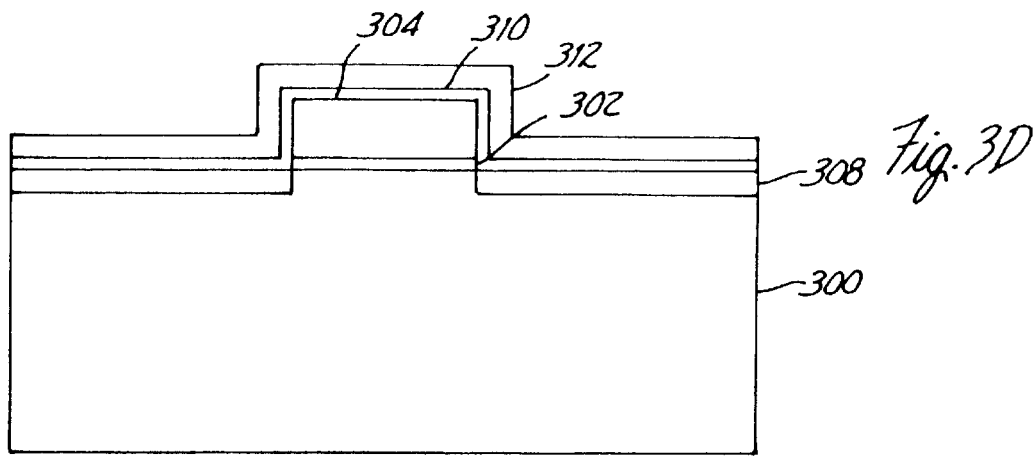
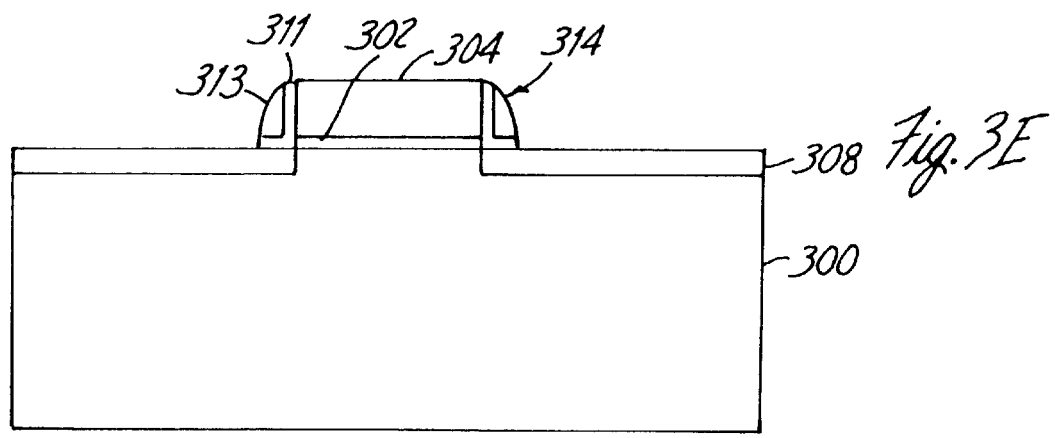
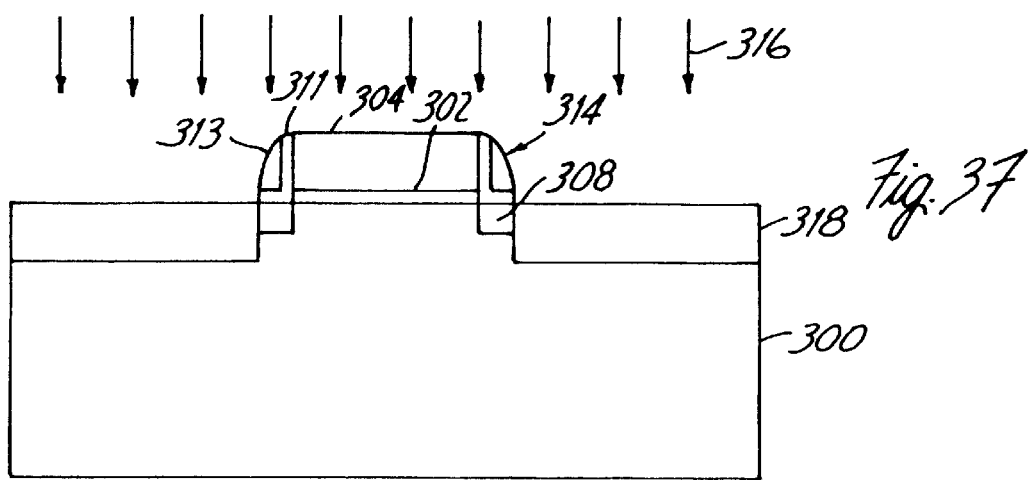

SEMICONDUCTOR DEVICE WITH VERTICAL HALO REGION AND METHODS OF MANUFACTURE

FIELD OF THE INVENTION

The present invention is directed to semiconductor devices and method of making these devices. In particular, the present invention is directed to semiconductor devices having a vertical halo region below a lightly-doped drain region and adjacent to an active region and methods of making these devices.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits. Thus, such circuits realize improved performance and lower costs as the performance of the MOS transistor is increased and as the manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent to the gate electrodes by heavily doping the regions with a dopant material of a desired conductivity. The conductivity of the doped region depends on the type and concentration of the impurity used to dope the region. The typical MOS transistor is symmetrical, which means that the source and drain are interchangeable. Whether a region acts as a source or drain typically depends on the respective applied voltages and the type of device being made. The collective term source/drain region is used herein to generally describe an active region used for the formation of either a source or drain.

A channel region is formed in the semiconductor substrate beneath the gate electrode and between the source and drain regions. The channel is typically lightly-doped with a dopant material. The gate electrode is generally separated from the substrate by an insulating layer, typically an oxide layer such as SiO$_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner, an electric field is used to control the current flow through the channel region. This type of device is commonly referred to as a MOS field-effect-transistor (MOSFET).

MOS devices typically fall in one of two groups depending on the type of dopant materials used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A number of different techniques and fabrication processes may be used to form MOS devices. With reference to FIGS. 1A–1E, one typical MOS fabrication process is depicted to form semiconductor structures with source/drain structures having heavily-doped regions and adjacent lightly-doped regions commonly referred to as lightly-doped drain (LDD) regions. LDD structures are often used in the formation of semiconductor devices having short channels to prevent or reduce short-channel effects.

As depicted in FIG. 1A, a gate electrode 103 is formed on a substrate 101. An LDD region 115 is formed in the substrate 101 by implanting a relatively low dose of a dopant material 110 into the exposed areas, as illustrated in FIG. 1B. Following the LDD implant, a spacer layer 116 is formed and etched to form spacers 117 on sidewalls of the gate electrode 103, as illustrated in FIGS. 1C and 1D. The substrate 101 is again implanted with a heavy dose of dopant material 120 aligned with the spacers 117 to form heavily-doped regions 118, which together with the LDD regions 115, form LDD source/drain structures 119, as illustrated in FIG. 1E. Following formation of the LDD structures 119, further processing such as silicidation and interconnect formation is performed. A more detailed description of the elements and fabrication of source/drain structures may be found in S. Wolf, *Silicon Processing for the VLSI Era*, Vol. 2: Processing Integration, pp. 354–363.

As semiconductor devices become smaller, the channel length becomes shorter. One problem of short channel junctions is punchthrough of carriers across the channel region from one heavily-doped region to the other in the absence of a gate current Punchthrough typically occurs due to the merging of the source and drain depletion areas. A variety of punchthrough implant techniques have been developed to overcome this problem. These include providing a punchthrough implant in the channel region prior to formation of the gate electrode. An alternative method includes forming a halo region adjacent to the heavily-doped active regions of the source/drain structures and below the LDD region using, for example, an angled implant of a dopant material having a different conductivity type than that of the heavily-doped regions and LDD regions. This halo region is typically formed after the heavily-doped and LDD regions. See, for example, S. Wolf, *Silicon Processing for the VLSI Era*, Vol. 3: The Submicron MOSFET, pp. 238–240, 309–311, and 621–22. As semiconductor devices become smaller, there is a need for methods that provide for greater precision in the alignment of structures in a device, including the heavily-doped, LDD, and halo regions, to ensure accurate and reproducible device structures.

SUMMARY OF THE INVENTION

Generally, the present invention relates to the formation of, as well as devices containing, a halo region below a lightly-doped region and adjacent to a lower portion of an active region to, at least in part, prevent or reduce punchthrough. In particular, the present invention relates to the formation of, as well as devices containing, a halo region vertically disposed below the lightly-doped region.

One method of forming a semiconductor device includes forming a gate electrode on a substrate and then forming a spacer adjacent to a sidewall of the gate electrode. An active region is formed in the substrate adjacent to the spacer and spaced apart from the gate electrode using a first dopant material of a first conductivity type. A protecting layer is formed over the active region and adjacent to the spacer. At least a portion of the spacer is then removed to form an opening between the protecting layer and the gate electrode. In some instances, the spacer may be formed by independent deposition of two different materials (e.g., silicon nitride and silicon dioxide), one of which can be selectively removed with respect to the other.

A lightly-doped region is formed in the substrate adjacent to the gate electrode using a second dopant material of the first conductivity type. This lightly-doped region may be formed, for example, prior to formation of the spacer, between the formation of two portions of the spacer, or after removing at least a portion of the spacer.

A halo region is formed through the opening resulting from removing a portion of the spacer. The halo region is deeper in the substrate than the lightly-doped region and is adjacent to the active region. The halo region is formed using a third dopant material of a conductivity type different than the first conductivity type. A second halo region may optionally be formed by implanting a fourth dopant material beneath the first halo region.

A semiconductor device includes a substrate and a gate electrode over the substrate. A lightly-doped region is in the substrate adjacent to the gate electrode and a heavily-doped active region is in the substrate adjacent to the lightly-doped active region. A first halo region is vertically disposed below the lightly-doped region and adjacent to the heavily-doped region. A second halo region is vertically disposed below the first halo region. The first and second halo regions are doped with a material of a conductivity type different than material used to dope the lightly-doped region and heavily-doped active region.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 3A through 3H illustrate an exemplary fabrication process for forming a semiconductor device in accordance with another embodiment of the invention.

Figure 1A:
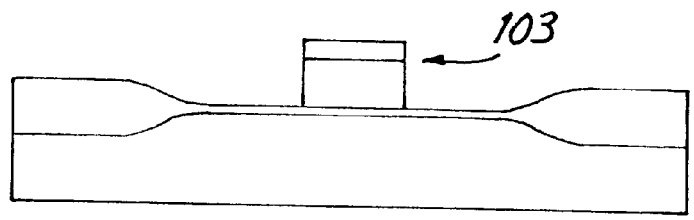
FIGS. 1A through 1E illustrate a conventional process for forming a semiconductor device.
Figure 1B:
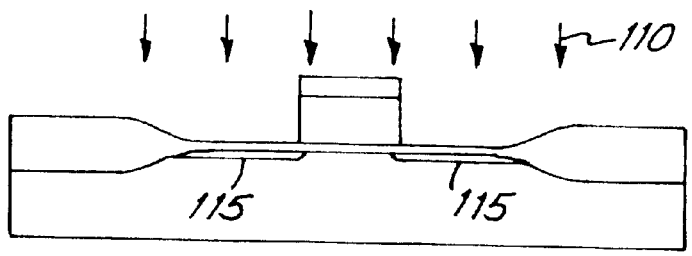
Figure 1C:
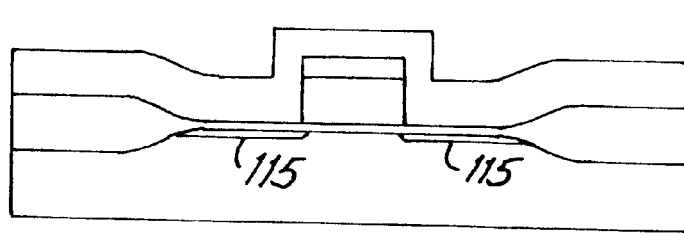
Figure 1D:
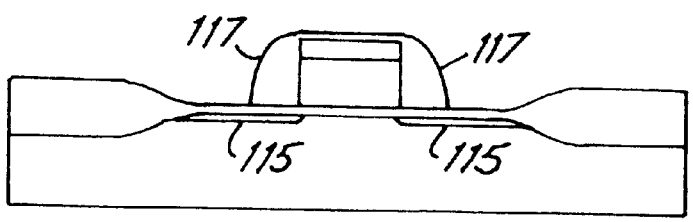
Figure 1E:
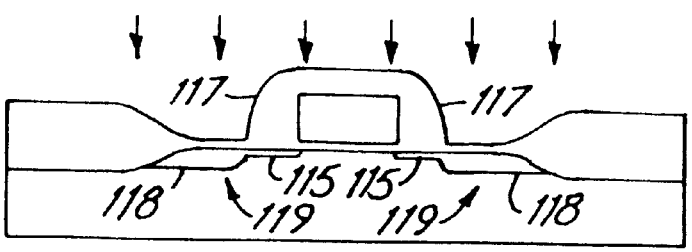

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to semiconductor devices and their formation. The invention is particularly suited for the formation of semiconductor devices with self-aligned heavily-doped active, LDD (lightly-doped drain), and halo regions. While the present invention is not so limited, an appreciation of various aspects of the invention will be gained through a discussion of the various application examples operating in such environments.

Figure 2A:
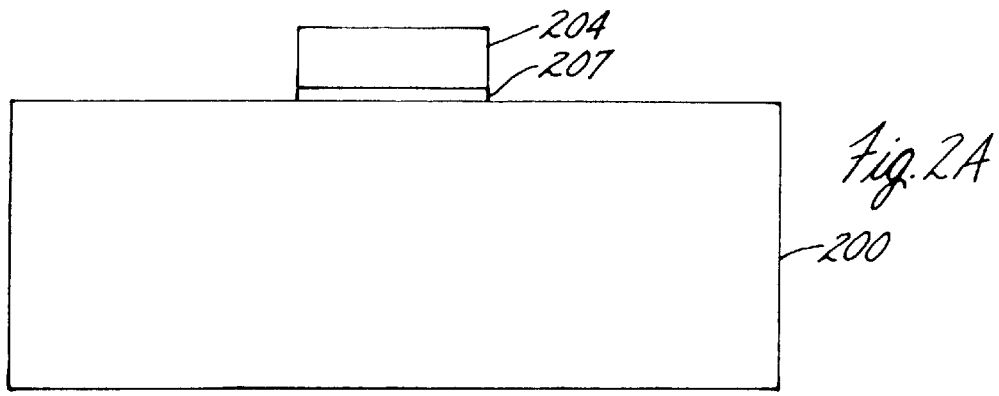
FIGS. 2A through 2I illustrate an exemplary fabrication process for forming a semiconductor device in accordance with one embodiment of the invention.

FIGS. 2A through 2I illustrate one example of a method for forming a semiconductor device according to the invention. A gate electrode 204 is formed over a substrate 200 and a gate insulating layer 202, as shown in FIG. 2A. The substrate 200 is typically a semiconductor material and can be, for example, silicon. The gate insulating layer 202 can be made using a variety of dielectric materials including, for example, silicon dioxide ($SiO_2$) and silicon oxynitride ($SiO_xN_y$). Other dielectric materials may be used for the gate insulating layer. The gate insulating layer can be made by a variety of methods including, for example, thermal oxidation of the substrate 200 in an inert, oxygen-, or nitrogen-bearing (e.g., NO or $N_2O$) ambient, chemical vapor deposition (CVD) of a dielectric material (e.g., tetraethyl orthosilicate (TEOS)), or physical vapor deposition. The thickness of the gate insulating layer 202 typically ranges from, for example, 15 to 200 angstroms, however, thinner or thicker insulating layers can be used.

The gate electrode 204 can be formed using a variety of materials including, for example, metals (e.g., aluminum, copper, tungsten, and titanium) or polysilicon. A polysilicon first electrode may be particularly useful if later processing procedures include high temperatures that could damage a metal structure. A variety of methods for formation of metal and polysilicon gate electrodes are known and may be used.

Figure 2B:
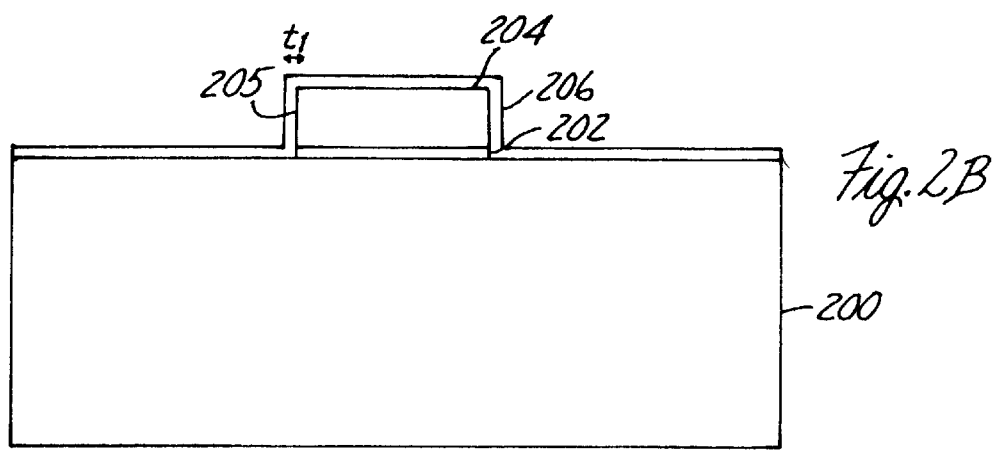

After formation of the gate electrode 204, a first spacer layer 206 is formed over the gate electrode 204 and substrate 200, as shown in FIG. 2B. In particular, the first spacer layer 206 is disposed against the sidewalls 205 of the gate electrode. The first spacer layer 206 is typically formed using a dielectric material, such as, for example, an oxide material, e.g., silicon dioxide. Other dielectric materials can also be used. The first spacer layer 206 can be formed by a variety of techniques, including, for example, chemical vapor deposition, physical vapor deposition, and thermal oxidation (if the gate electrode 204 is formed of polysilicon).

The thickness of the first spacer layer 206 may determine, at least in part, the dopant distribution of an LDD region formed in the substrate adjacent to the gate electrode, thus, the thickness, $t_1$, of the first spacer layer may be selected based on a desired LDD region structure. The thickness of the first spacer layer 206 (extending from the gate electrode 204) can be in the range of, for example, 50 to 150 Angstroms, although larger or smaller first spacer layers may be used.

Figure 2C:
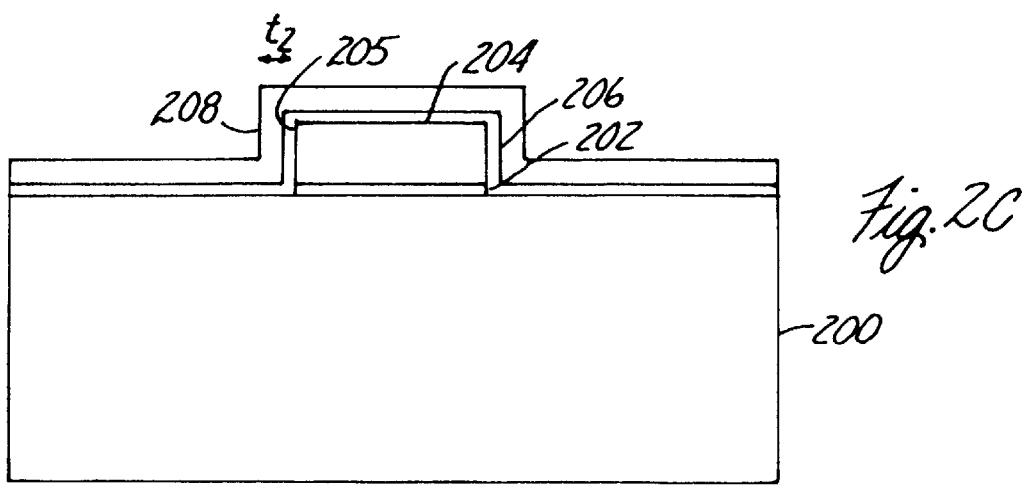

A second spacer layer 208 is formed over the first spacer layer 206, as shown in FIG. 2C. The second spacer layer 208 is typically formed of a material that can be selectively etched with respect to the material of the first spacer layer 206. For example, if the first spacer layer 206 is formed using silicon dioxide, the second spacer layer 208 can be formed using silicon nitride. Other combinations for the first and second spacer layers 206, 208 can be used. The second spacer layer 208 can be formed by a variety of techniques, including, for example, chemical vapor deposition and physical vapor deposition.

The combined thicknesses of the first and second spacer layers may determine, at least in part, the separation of a heavily doped active region formed in the substrate from the gate electrode. In addition, the thickness, $t_2$, of the second spacer layer may determine, at least in part, the size of a lightly-doped region formed in the substrate between the active region and the gate electrode. The thickness of the second spacer layer is selected in view of these considerations. The thickness, $t_2$, of the second spacer layer 208 (extending from the first spacer layer 206) can be in the range of, for example, 150 to 400 Angstroms, although larger or smaller second spacer layers may be used.

Figure 2D:
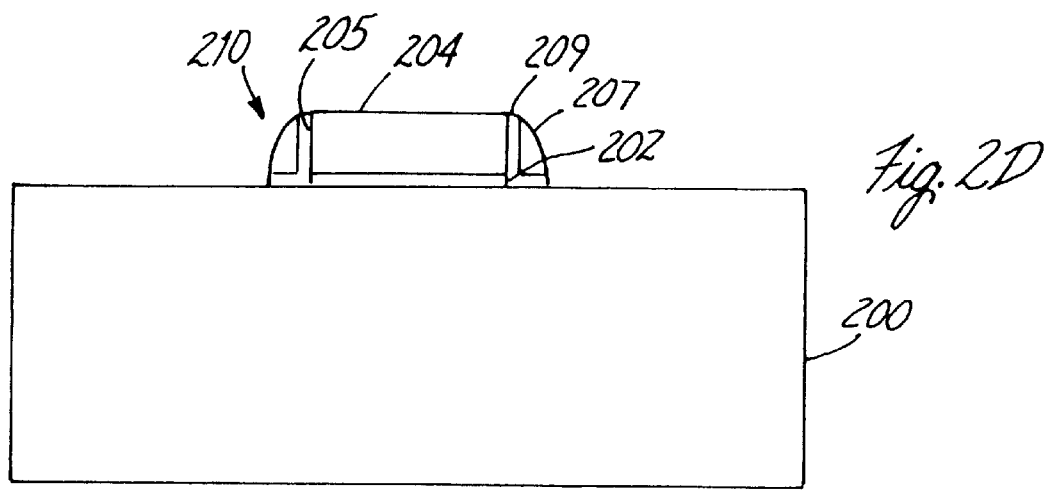

After formation of the first and second spacer layers 206, 208, a portion of these layers 206, 208 is removed to form spacer structures 210 with first and second spacers 207, 209 on the sidewalls 205 of the gate electrode 204, as illustrated in FIG. 2D. The first and second spacers 207, 209 can be formed from the first and second spacer layers 206, 208 by a variety of etching techniques, including, for example, anisotropic etching. This technique typically includes the removal of portions of the first and second spacer layers 206, 208 disposed horizontally over the gate electrode 204 and the substrate 200, leaving the vertical portions disposed on the sidewalls 205 of the gate electrode 204. The removal of portions of the first and second spacer layers 206, 208 can be performed simultaneously or in separate steps for the two layers 206, 208. In some embodiments, a portion of the first spacer layer 206 (typically less than about 50 Angstroms) is left over the horizontal regions of the gate electrode and the substrate as a protective layer, particularly if the first spacer layer 206 is formed of silicon dioxide.

Figure 2E:
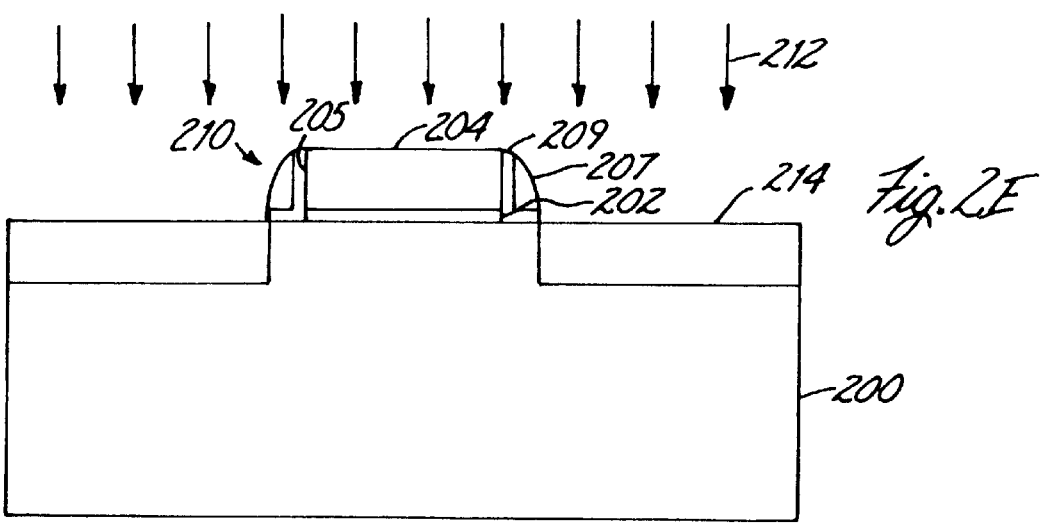

A first dopant material 212 is then implanted in the substrate 200 to form active regions 214 that are spaced apart from the gate electrode 204 by the spacer structures 210, as shown in FIG. 2E. The first dopant material 212 can be a p-type dopant, such as, for example, boron, boron hydride, or a boron halide, or an n-type dopant, such as, for example, phosphorus or arsenic. The choice of the first dopant material 212 depends on the type (e.g., NMOS or PMOS) of semiconductor device being formed. The implant energies of the first dopant material 212 can be in the range of, for example, 5 to 30 keV and the dopant dosage can be in the range of, for example, 5E14 ($5 \times 10^{14}$) dopant atoms/cm$^2$ to 5E15 ($5 \times 10^{15}$) dopant atoms/cm$^2$, although higher or lower implant energies and dopant dosages may be used.

The partially fabricated device may be annealed after forming the active regions 214 using, for example, rapid thermal anneal (RTA) techniques. This activates the dopant material in the active regions 214 and may drive the dopant material deeper into the substrate 200 and provide a more uniform distribution of the dopant material. This may also cause some lateral diffusion of the dopant material. The temperature to which the substrate 200 is heated typically ranges from, for example, 800 to 950° C. for periods of time ranging from, for example, 30 to 60 seconds. This anneal process may be performed at any time in the process after the implantation of the first dopant material, but is typically performed prior to formation of the halo region(s) described below.

After formation of the active regions 214, a protecting layer 216 is formed over the active regions 214. The protecting layer 216 can be formed by, for example, depositing a dielectric material over the substrate 200 and optionally over the gate electrode 204 and spacer structure 210. Typically, the protecting layer is formed of a material, such as silicon dioxide, that allows the material of the second spacer 209 to be selectively etched. The protecting layer 216 can be formed by a variety of techniques, including, for example, chemical vapor deposition, physical vapor deposition, or spin-on glass formation.

Figure 2F:
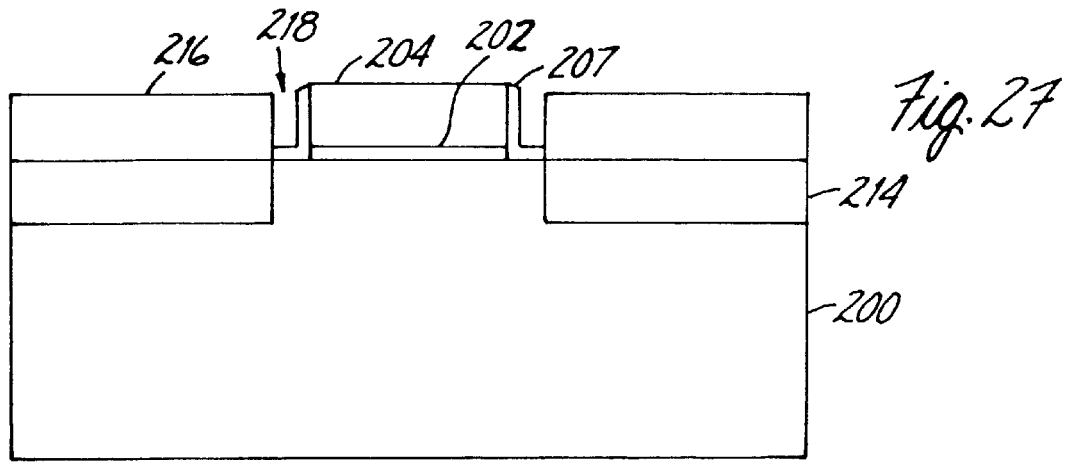

A portion of the protecting layer 216 can then be removed, particularly any portion of the protecting layer 216 over the gate electrode 204. This can be accomplished using techniques, such as, for example, chemical, mechanical, or chemical/mechanical polishing. A remaining portion of the protecting layer 216 is left substantially over the active regions 214, as shown in FIG. 2F. In some instances, a portion of the gate electrode 204 may be removed with the removal of a portion of the protecting layer 216 and/or in a second removal step. This can be accomplished using techniques, such as, for example, chemical, mechanical, or chemical/mechanical polishing. This process may also include removing additional portions of the protecting layer 216 and is useful for polishing the surface of the gate electrode 204.

The second spacers 209 are then removed to form openings 218 between the first spacers 207 and the protecting layer 216. The resultant structure is shown in FIG. 2F. The second spacers 209 are typically removed using a selective etching technique. For example, silicon nitride second spacers 209 can be selectively etched with respect to silicon dioxide first spacers 207 and a silicon dioxide protecting layer 216.

Figure 2G:
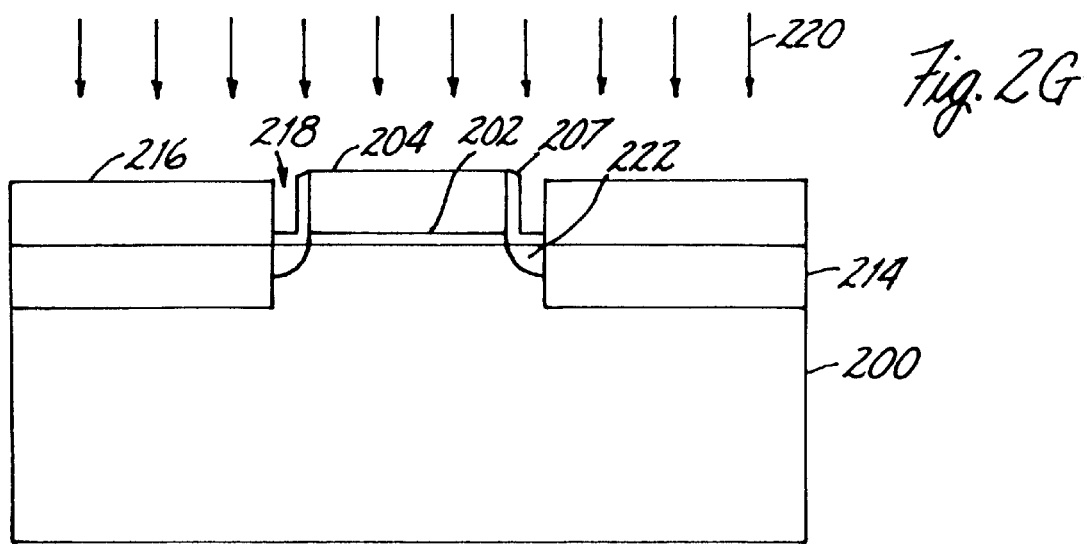

After the forming the protecting layer 216 and the openings 218, a second dopant material 220 is implanted through the openings 218 into the substrate 200 to form LDD regions 222 adjacent to the gate electrode 204 and the active regions 214, as shown in FIG. 2G. The second dopant material 220 is the same conductivity type, although not necessarily the same material, as the first dopant material 212. The implant energies of the second dopant material 220 can be in the range of, for example, 2 to 25 keV and the dopant dosage can be in the range of, for example, 1E13 ($1 \times 10^{13}$) dopant atoms/cm$^2$ to 5E14 ($5 \times 10^{14}$) dopant atoms/cm$^2$, although higher or lower implant energies and dopant dosages may be used. The second dopant material in the LDD regions may optionally be annealed by heating after implantation.

Figure 2H:
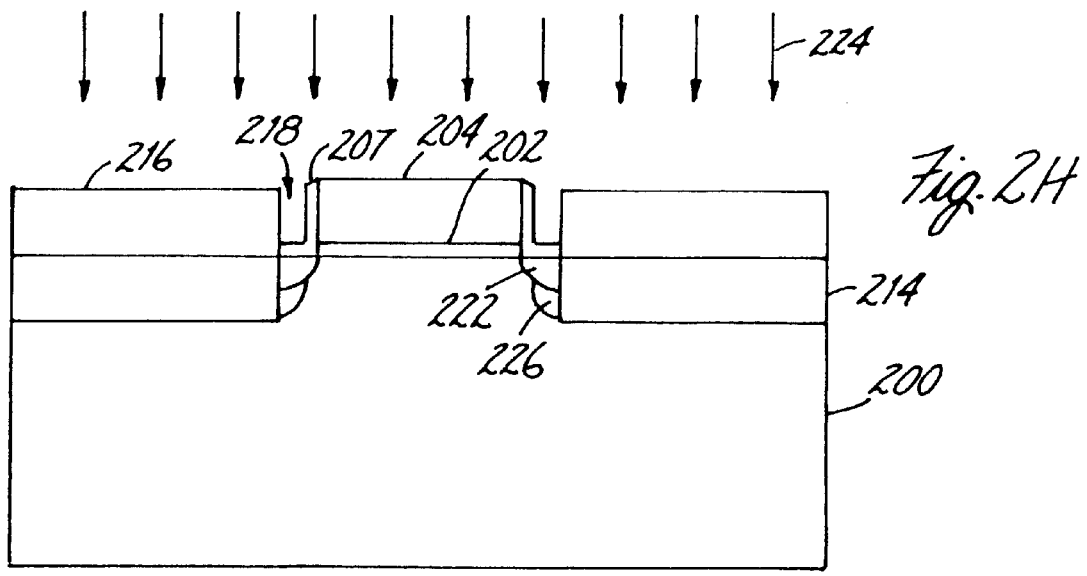
Figure 2I:
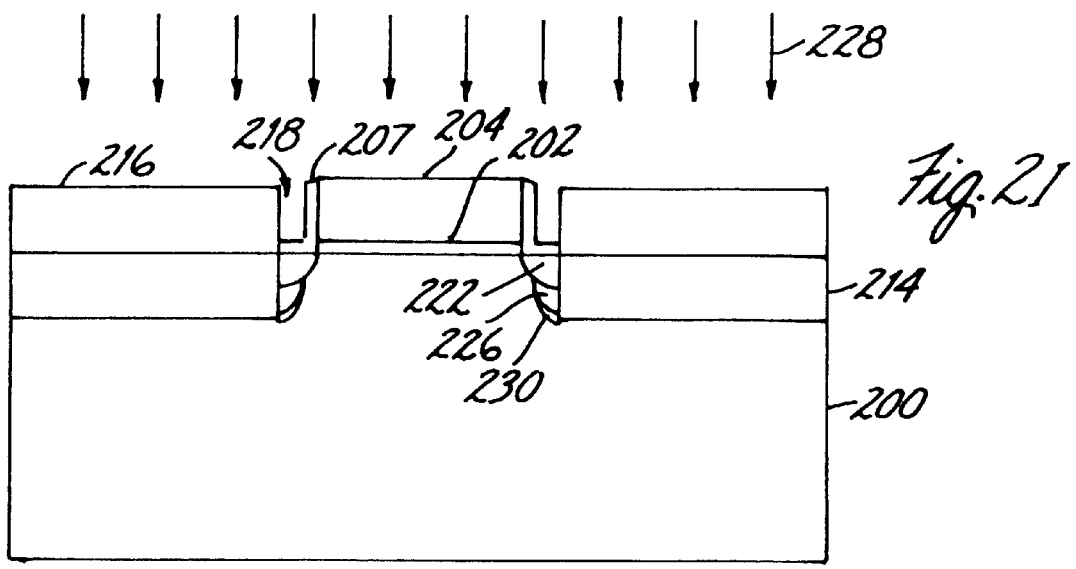

After forming the LDD regions 222, a third dopant material 224 is implanted through the openings 218 to form first halo regions 226 that are deeper into the substrate 200 than the LDD regions 222 and adjacent to a lower portion of the active regions 214, as shown in FIG. 2H. The third dopant material 224 is of a conductivity type different than that of the first and second dopant materials 212, 220 (i.e., if the first and second dopant materials are p-type than the third dopant material is n-type). In alternative embodiments, the third dopant material may be implanted prior to the second dopant material. The implant energies of the third dopant material 216 can be in the range of, for example, 5 to 40 keV and the dopant dosage can be in the range of, for example, 5E12 ($5 \times 10^{12}$) dopant atoms/cm$^2$ to 1E14 ($1 \times 10^{14}$) dopant atoms/cm$^2$, although higher or lower implant energies and dopant dosages may be used. In at least some embodiments, the protecting layer 216 is sufficiently thick when the third dopant material is implanted to prevent or substantially reduce the implantation of the third dopant material into the active regions 214.

Optionally, a fourth dopant material 228 is implanted through the openings 218 to form optional second halo regions 230 that are deeper in the substrate than the first halo regions 228, as shown in FIG. 2H. The optional fourth dopant material 228 is of the same conductivity type as the third dopant material 224. The implant energies of the optional fourth dopant material 228 are, for example, 5 to 15 keV larger than the implant energies of the third dopant material 224, and the dopant dosage can be in the range of, for example, 5E12 ($5 \times 10^{12}$) dopant atoms/cm$^2$ to 1E14

($1 \times 10^{14}$) dopant atoms/cm$^2$. In some embodiments, the fourth dopant material may be implanted prior to the second and/or third dopant materials. In at least some embodiments, the protecting layer 216 is sufficiently thick when the fourth dopant material is implanted to prevent or substantially reduce the implantation of the fourth dopant material into the active regions 214. Additional processing steps, including, for example, reformation or enlargement of the spacer, silicidation, interconnect formation, and so forth may be performed to complete the ultimate device structure.

Using the methods illustrated in FIGS. 2A–2I, active regions 214, halo regions 226, 230, and LDD regions 222 are formed using a self-aligned process based, at least in part, on the provision of spacer structures 210. This self-aligned process can result in the formation of semiconductor devices with greater uniformity than those formed by conventional techniques. As an additional advantage, the halo regions are formed using a protecting layer that can prevent implantation of the halo region dopant material into the active regions. This can be advantageous as it may allow for shallower active regions and junctions. Many conventional techniques do not protect the active regions during implantation of dopant material to form the halo regions.

Figure 3A:
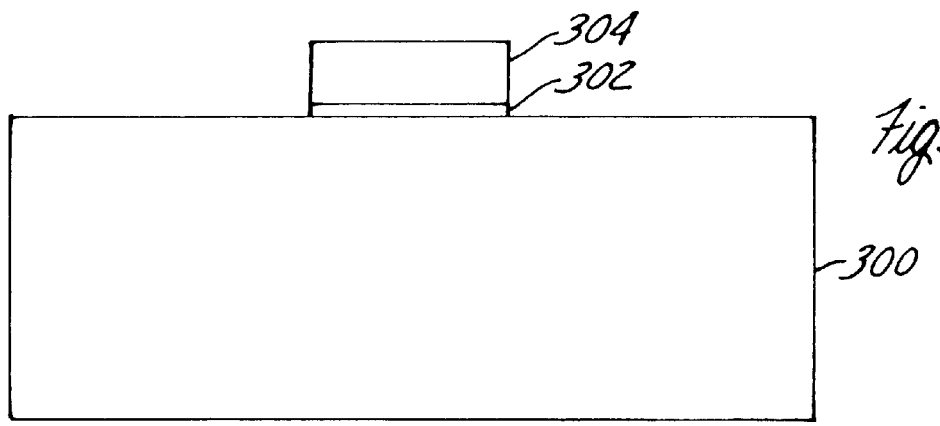
Figure 3B:
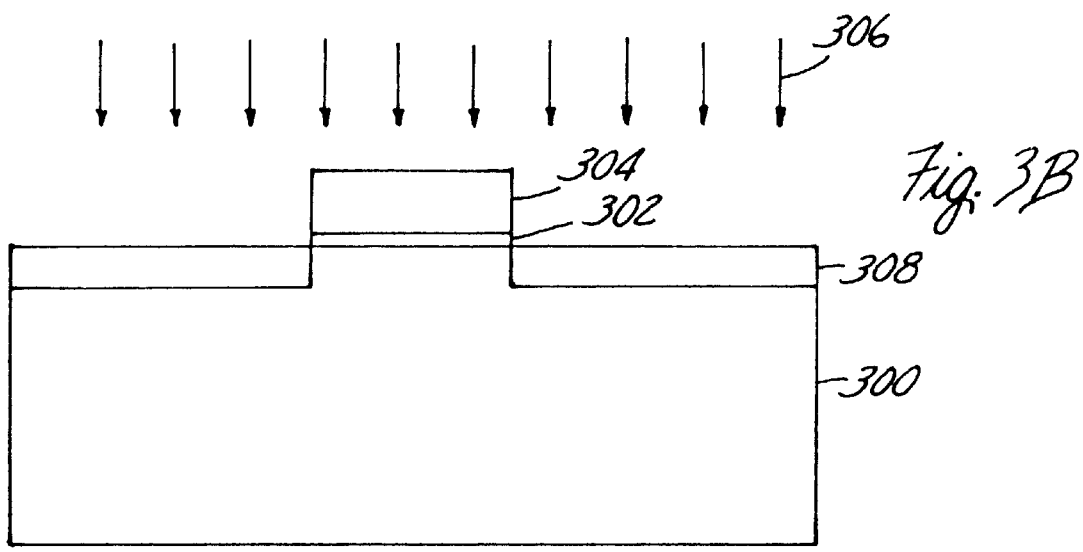

Another method is illustrated in FIGS. 3A through 3H. The process materials and conditions are the same as the method illustrated in FIGS. 2A through 2I unless otherwise indicated. The method includes forming a gate insulation layer 304 and gate electrode 302 on a substrate 300, as shown in FIG. 3A. A first dopant material 306 is implanted into the substrate to form LDD regions 308, as shown in FIG. 3B. The implant energies of the first dopant material 306 can be in the range of, for example, 2 to 25 keV and the dopant dosage can be in the range of, for example, 1E13 ($1 \times 10^{13}$) dopant atoms/cm$^2$ to 5E14 ($5 \times 10^{14}$) dopant atoms/cm$^2$, although higher or lower implant energies and dopant dosages may be used. The LDD regions may optionally be annealed by heating the substrate.

Figure 3C:
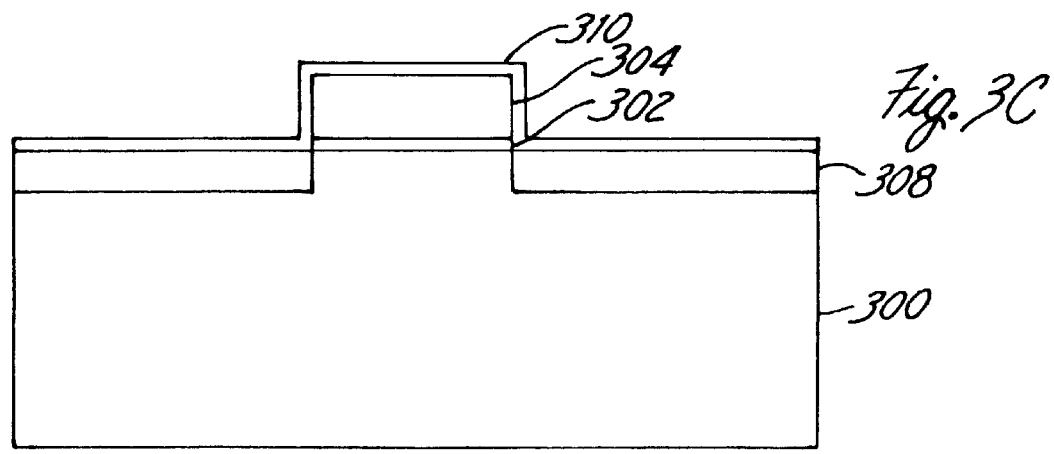

A first spacer layer 310 is formed over the substrate 300 and on a sidewall 305 of the gate electrode 304, as shown in FIG. 3C. The materials, thickness, and methods of forming the first spacer layer 310 are the same as the first spacer layer 206 illustrated in FIG. 2B. In an alternative embodiment, the first spacer layer is formed prior to forming the LDD regions. The first dopant material may then be implanted into the substrate through the first spacer layer.

A second spacer layer 312 is formed over the first spacer layer 310, as shown in FIG. 3D. The second spacer layer 312 can be formed using the same materials, thickness, and methods as the second spacer layer 208 illustrated in FIG. 2C. Portions of the first and second spacer layers 310, 312 can then be removed to leave first spacers 311 and second spacers 313 that form spacer structures 314 along the sidewalls 305 of the gate electrode 304.

A second dopant material 316 is implanted into the substrate 300 to form active regions 318 spaced apart from the gate electrode 304 by the spacer structures 314, as illustrated in FIG. 3E. The second dopant material 316 is of the same conductivity type as the first dopant material 306, although not necessarily the same material. The implant energies of the second dopant material 316 can be in the range of, for example, 5 to 30 keV and the dopant dosage can be in the range of, for example, 5E14 ($5 \times 10^{14}$) dopant atoms/cm$^2$ to 5E15 ($5 \times 10^{15}$) dopant atoms/cm$^2$, although higher or lower implant energies and dopant dosages may be used. The active regions may optionally be annealed by heating the substrate.

Figure 3G:
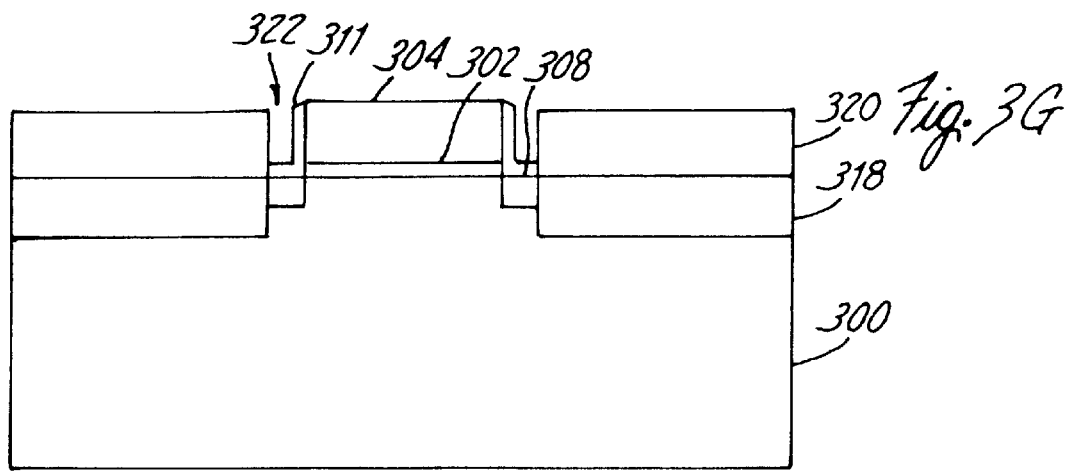

A protective layer 320, using the same materials, thicknesses, and processes as the protective layer 216 illustrated in FIG. 2F, is formed over the active regions 318, as shown in FIG. 3G. The second spacers 313 are then removed to form openings 322 between the first spacers 311 and the protective layer 320, as also shown in FIG. 3G.

Figure 3H:
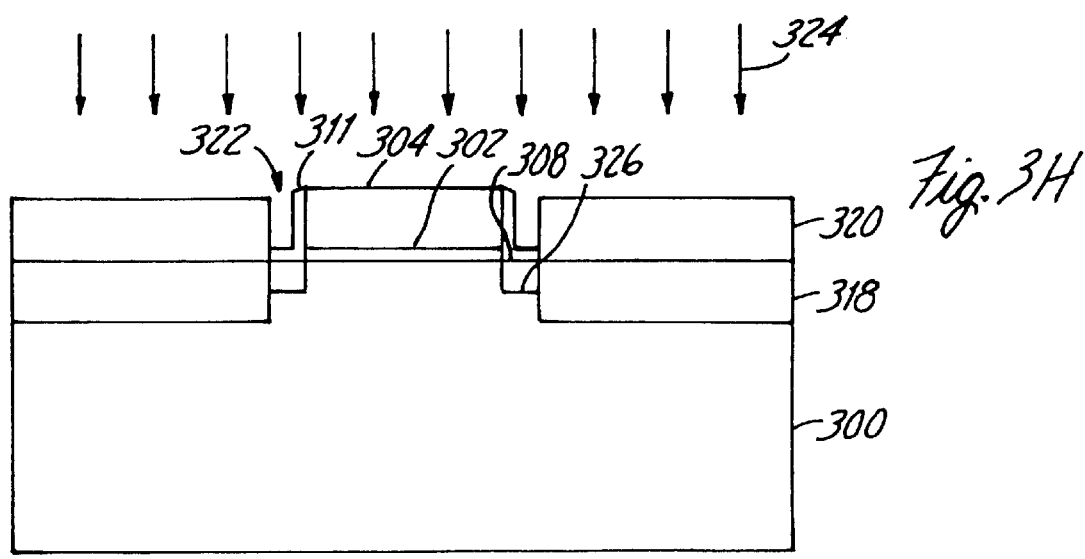

A third dopant material 324 is implanted into the substrate 300 through the opening 322 to form first halo regions 326 below the LDD regions 308 and adjacent to a lower portion of the active regions 318, as shown in FIG. 3H. The third dopant material 324 is of a conductivity type different than that of the first and second dopant materials 306, 316 (i.e., if the first and second dopant materials are p-type than the third dopant material is n-type). The implant energies of the third dopant material 324 can be in the range of, for example, 5 to 40 keV and the dopant dosage can be in the range of, for example, 5E12 ($5 \times 10^{12}$) dopant atoms/cm$^2$ to 1E14 ($1 \times 10^{14}$) dopant atoms/cm$^2$, although higher or lower implant energies and dopant dosages may be used. Optionally, a fourth dopant material (not shown) can be implanted in the substrate to form second halo regions (not shown) beneath the first halo regions.

Yet another method of forming a semiconductor device with self-aligned active, halo, and LDD regions includes forming a spacer structure with a single layer of a material that can be selectively etched with respect to the protective layer. This modification can be made to either of the processes illustrated in FIGS. 2A through 2I or FIGS. 3A through 3H. This single layer of material has a thickness of, for example, 200 to 500 Angstroms. The spacer structure is removed either completely or partially (leaving only a thin (e.g., 50 Angstroms or less) portion of the spacer structure) after formation of the protecting layer to provide openings through which dopant material can be implanted to form LDD regions and/or halo regions.

Optionally, a halo region may be selectively formed on one side of the gate electrode by masking off the other side using, for example, a layer of dielectric material. In addition, CMOS devices can be formed by a variety of techniques that utilize masking (e.g., masking with a dielectric or photoresist layer). For example, PMOS and NMOS portions of the CMOS device can be formed independently (e.g., forming PMOS portions, masking the PMOS portions, and then forming the NMOS portions) or they can be formed simultaneously, except that one portion is masked during the implantation of a particular dopant material in the other portion (e.g., the PMOS portions are masked during implant of the first, second, third, or fourth dopant material in the NMOS portion and then the NMOS portion is masked during implant of the first, second, third, or fourth dopant material in the PMOS portion.)

As noted above, the present invention is applicable to a number of different devices and systems that include a halo region to prevent or reduce punchthrough between active regions. Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A method of forming a semiconductor device, comprising:

forming a gate electrode on a substrate;

forming a spacer adjacent to a sidewall of the gate electrode;

forming an active region, using a first dopant material of a first conductivity type, in the substrate adjacent to the spacer and spaced apart from the gate electrode;

forming a protecting layer over the active region and adjacent to the spacer;

removing at least a portion of the spacer to form an opening between the protecting layer and the gate electrode;

forming a lightly-doped region in the substrate adjacent to the gate electrode using a second dopant material of the first conductivity type;

forming a first halo region through the opening, deeper in the substrate than the lightly-doped region and adjacent to the active region, using a third dopant material of a second conductivity type different than the first conductivity type; and forming a second halo region below the first halo region using a fourth dopant material of the second conductivity type.

2. The method of claim 1, wherein forming a lightly-doped region comprises forming a lightly-doped region in the substrate through the opening using a second dopant material.

3. The method of claim 1, wherein forming a lightly-doped region comprises forming a lightly-doped region in the substrate, prior to forming the spacer, using a second dopant material.

4. The method of claim 1, wherein forming a spacer comprises forming a first spacer adjacent to a sidewall of the gate electrode, and forming a second spacer adjacent to the first spacer and spaced apart from the gate electrode.

5. The method of claim 4, wherein selectively removing at least a portion of the spacer comprises selectively removing the second spacer and leaving the first spacer to form an opening between the protecting layer and the first spacer.

6. The method of 4, wherein forming a first spacer comprises forming a first spacer layer over the substrate and adjacent to the sidewall of the gate electrode and forming a second spacer comprises forming a second spacer layer over the first spacer layer.

7. The method of claim 6, further comprising removing portions of the first and second spacer layers to form the first and second spacers.

8. The method of claim 6, wherein forming the lightly-doped region comprises forming a lightly-doped region in the substrate, subsequent to forming the first spacer layer and prior to forming the second spacer layer, using the second dopant material.

9. The method of claim 1, wherein removing at least a portion of the spacer comprises selectively removing a portion of the spacer.

10. The method of claim 1, wherein removing at least a portion of the spacer comprises removing all of the spacer to form an opening between the protective layer and the gate electrode.

11. The method of claim 1, wherein at least a portion of the spacer layer is formed of a material that can be selectively removed with respect to the protecting layer.

12. The method of claim 1, wherein the second halo region is formed prior to the first halo region.

13. The method of claim 1, wherein forming the first halo region comprises implanting the third dopant in the substrate at a first implantation energy to form the first halo region and forming the second halo region comprises implanting the fourth dopant at a second implantation energy higher than the first implantation energy to form the second halo region below the first halo region.

14. A method of forming a semiconductor device, comprising:

forming a gate electrode on a substrate;

forming a first spacer adjacent to a sidewall of the gate electrode;

forming a second spacer adjacent to the first spacer;

implanting a first dopant material of a first conductivity type in the substrate to form an active region adjacent to the first and second spacers and spaced apart from the gate electrode;

forming a protecting layer over the active region and adjacent to the first and second spacers;

selectively removing the second spacer and leaving the first spacer to form an opening between the protecting layer and the gate electrode;

implanting a second dopant material of the first conductivity type in the substrate to form a lightly-doped region adjacent to the gate electrode;

implanting a third dopant material through the opening and into the substrate to form a first halo region deeper in the substrate than the lightly-doped region and adjacent to the active region, wherein the third dopant material is of a second conductivity type different than the first conductivity type; and implanting a fourth dopant material of the second conductivity type into the substrate to form a second halo region below the first halo region.

15. The method of claim 14, wherein implanting the second dopant material comprises implanting the second dopant material through the opening and into the substrate to form a lightly-doped region adjacent to the gate electrode.

16. The method of claim 14, wherein implanting the second dopant material comprises implanting the second dopant material in the substrate prior to forming the first and second spacers to form a lightly-doped region adjacent to the gate electrode.

17. The method of claim 14, wherein forming a first spacer and forming a second spacer comprises forming a first spacer layer over the substrate and adjacent to a sidewall of the gate electrode, forming a second spacer layer over the first spacer layer, and removing a portion of the first and second spacer layers to form first and second spacers.

18. The method of claim 17, wherein implanting a second dopant material comprises implanting a second dopant material of the first conductivity type in the substrate, subsequent to forming the first spacer layer and prior to forming the second spacer layer, to form a lightly-doped region adjacent to the gate electrode.

19. The method of claim 14, further comprising removing a portion of the first spacer prior to implanting the third dopant material in the substrate.

20. The method of claim 14, wherein the third dopant material is implanted prior to the fourth dopant material.

21. The method of claim 14, wherein implanting the third dopant material comprises implanting the third dopant in the substrate at a first implantation energy to form the first halo region and implanting the fourth dopant material comprises implanting the fourth dopant at a second implantation energy higher than the first implantation energy to form the second halo region below the first halo region.

* * * * *